US008641217B2

(12) United States Patent
Hirano

(10) Patent No.: US 8,641,217 B2
(45) Date of Patent: Feb. 4, 2014

(54) ELECTRONIC APPARATUS

(71) Applicant: Sony Corporation, Tokyo (JP)

(72) Inventor: Shinsaku Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/675,171

(22) Filed: Nov. 13, 2012

(65) Prior Publication Data

US 2013/0163227 A1    Jun. 27, 2013

(30) Foreign Application Priority Data

Dec. 22, 2011 (JP) .................................. 2011-281971

(51) Int. Cl.
  *G09F 13/04* (2006.01)
(52) U.S. Cl.
  USPC ..................................... 362/97.1; 361/679.01
(58) Field of Classification Search
  USPC ................. 362/97.1; 361/679.01–67, 679.21, 361/679.26, 679.55, 679.56
  See application file for complete search history.

(56) References Cited

U.S. PATENT DOCUMENTS

| 2008/0204981 | A1* | 8/2008 | Rae et al. ...................... 361/679 |
| 2010/0296235 | A1* | 11/2010 | Takemasa et al. ....... 361/679.21 |
| 2012/0262854 | A1* | 10/2012 | Robert ..................... 361/679.01 |
| 2012/0287562 | A1* | 11/2012 | Wu et al. .................. 361/679.01 |
| 2012/0300376 | A1* | 11/2012 | Chang et al. ............. 361/679.01 |
| 2013/0032432 | A1* | 2/2013 | Slotta ............................ 181/199 |
| 2013/0083496 | A1* | 4/2013 | Franklin et al. ............... 361/749 |
| 2013/0107429 | A1* | 5/2013 | Zhou ........................ 361/679.01 |

FOREIGN PATENT DOCUMENTS

JP    4798462    8/2011

* cited by examiner

*Primary Examiner* — Anne Hines
(74) *Attorney, Agent, or Firm* — Oblon, Spivak, McClelland, Maier & Neustadt, L.L.P.

(57) ABSTRACT

An electronic apparatus includes a main body portion, a back surface portion, a movable portion, and a back surface member. The main body portion includes a display portion and is configured to process inputted information. The back surface portion is configured to cover a back surface of the main body portion on an opposite side of the display portion. The movable portion is mounted to a rear surface of the back surface portion on an opposite side of an opposite surface of the back surface portion, the opposite surface being opposed to the main body portion. The back surface member has stretch properties and is configured to cover the back surface portion and the movable portion.

9 Claims, 14 Drawing Sheets

FIG.10A
FIG.10B
FIG.10C
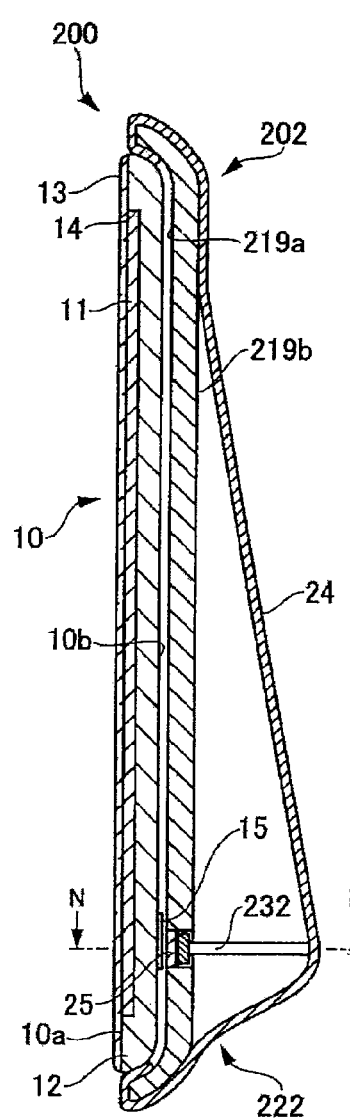
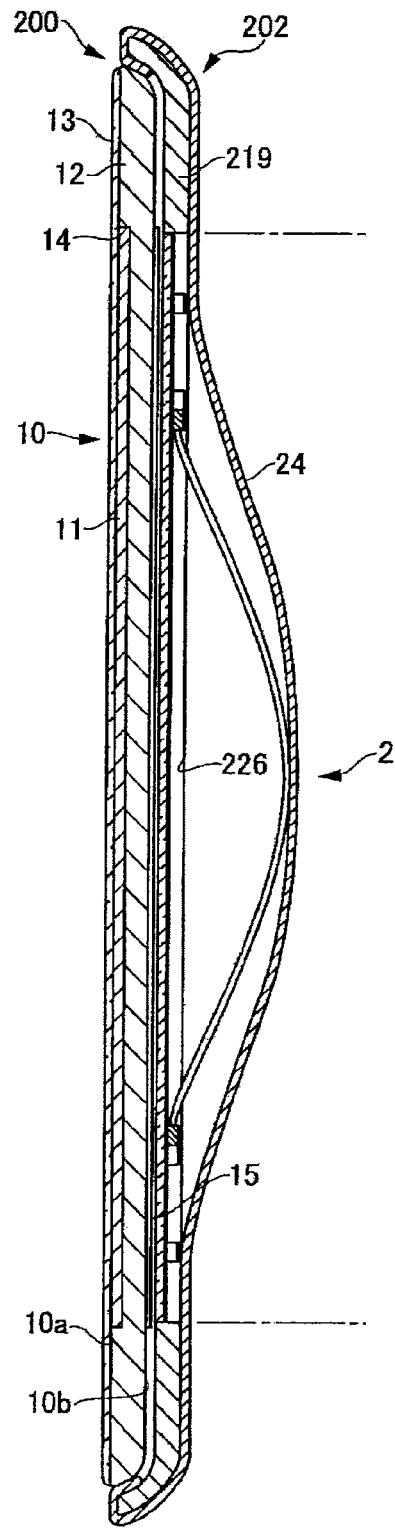
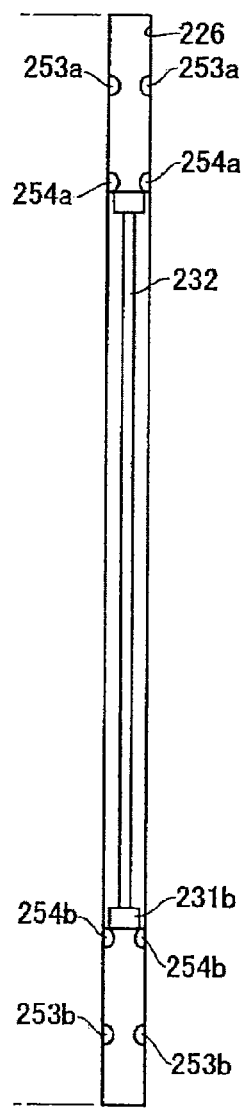

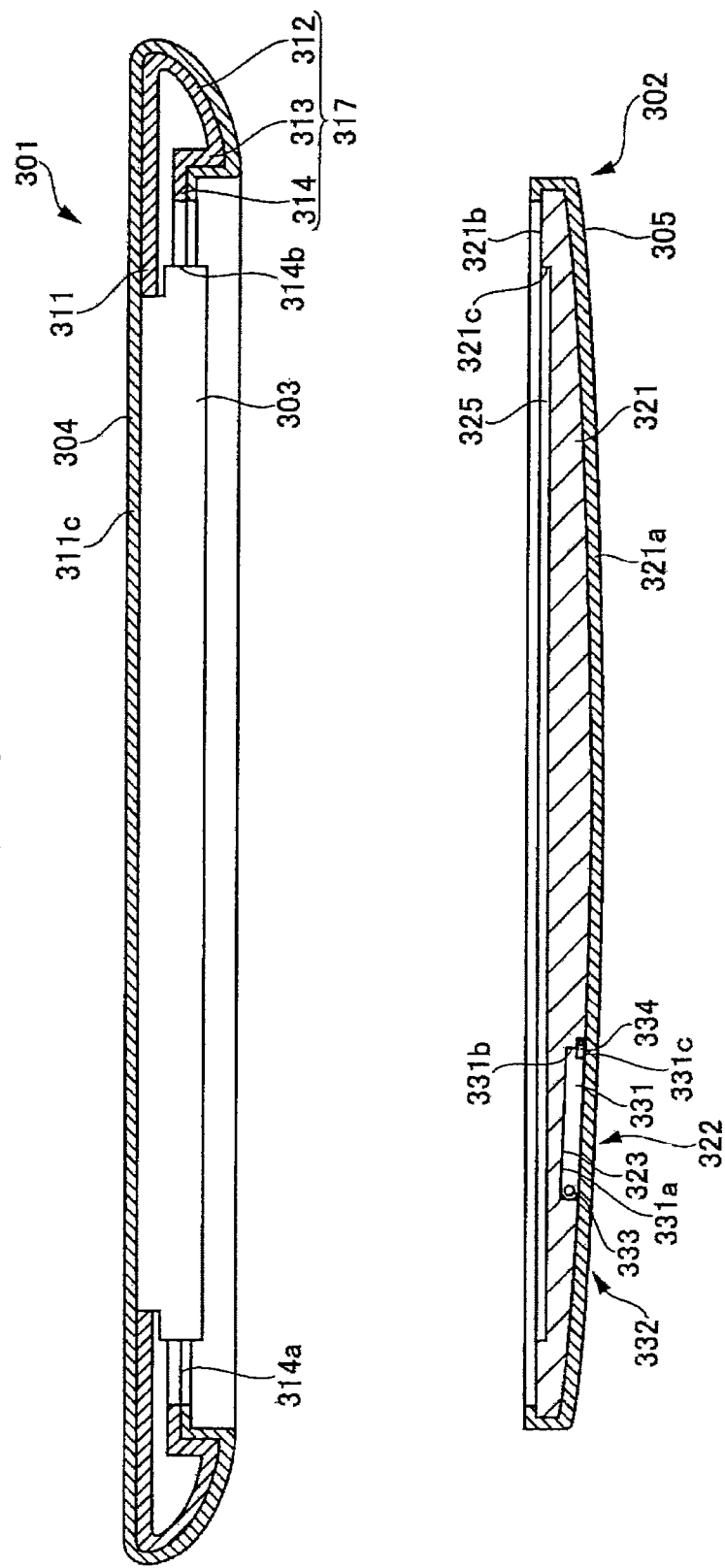

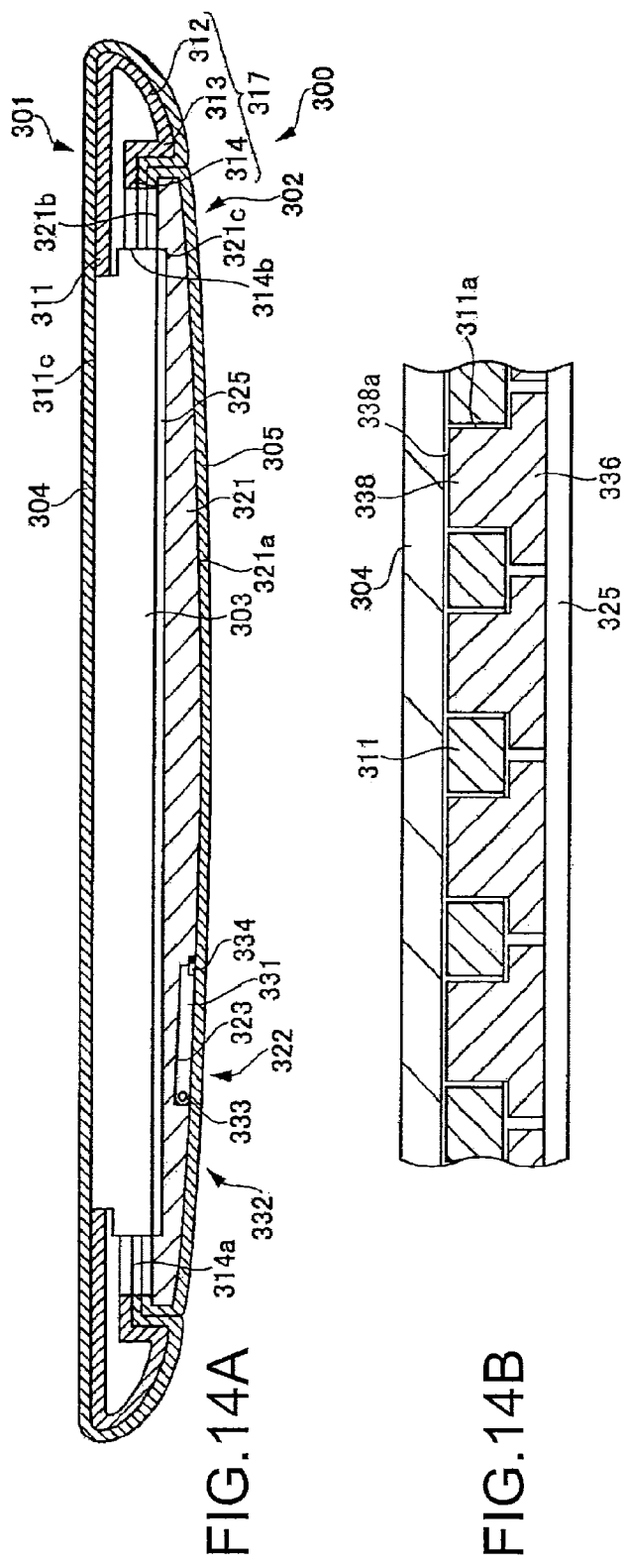
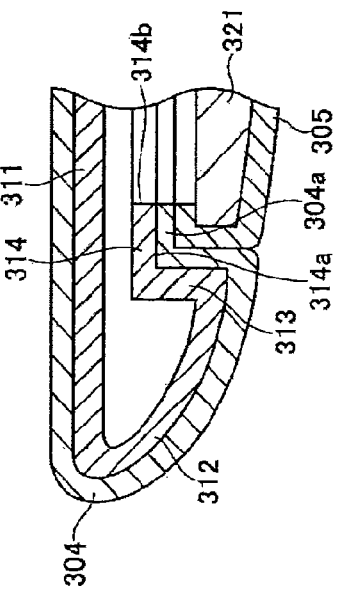
FIG. 14A
FIG. 14B
FIG. 14C

ELECTRONIC APPARATUS

BACKGROUND

The present disclosure relates to an electronic apparatus such as a personal computer and a television receiver with a display portion.

As a traditional electronic apparatus, a personal computer, a television receiver, a mobile terminal are exemplified. In order for a user to view an image displayed on such an electronic apparatus, a rear surface of the electronic apparatus is provided with a stand. The stand holds a posture of the electronic apparatus and increases a degree of freedom in viewing mode of the user (see, Japanese Patent No. 4798462 (hereinafter, referred to as Patent Document 1)). Further, the electronic apparatus is provided with a grip in order for the user to carry it.

Patent Document 1 describes an image display apparatus. Specifically, in this image display apparatus, a display surface on which an image is to be displayed is provided in a front surface of a casing and a stand formed of a linearly extending rod is provided in a rear surface of the casing on an opposite side of the display surface. The stand is coupled to the rear surface of the casing through a coupling mechanism. Further, the coupling mechanism supports the stand so as to be pivotal between a falling-down position where the stand falls down on the rear surface of the casing and a standing position where the stand stands from the rear surface of the casing.

SUMMARY

However, in the image display apparatus described in Patent Document 1, the stand is formed of a separate member and then mounted to the casing of the image display apparatus. Thus, the traditional electronic apparatus has a seam between the casing and a movable portion such as the stand and the grip, which is visible to the outside. Therefore, the appearance of the electronic apparatus is not good and the integrity of a product is not provided.

In view of the above-mentioned circumstances, it is desirable to provide an electronic apparatus that is capable of achieving an improvement in appearance of a product without the need of separately mounting the stand, the grip, and the like.

According to an embodiment of the present disclosure, there is provided a keyboard including a main body portion, a back surface portion, a movable portion, and a back surface member.

The main body portion includes a display portion and is configured to process inputted information. The back surface portion is configured to cover a back surface of the main body portion on an opposite side of the display portion. The movable portion is mounted to a rear surface of the back surface portion on an opposite side of the main body portion. The back surface member has stretch properties and is configured to cover the back surface portion and the movable portion.

In the electronic apparatus according to the embodiment of the present disclosure, the back surface portion to which the movable portion is mounted is covered with the back surface member. Thus, the movable portion is integrated with the back surface portion, which makes it unnecessary to separately mount the movable portion such as the stand and the grip. Further, the back surface member hides a seam between the movable portion and the back surface portion, and hence the appearance is improved and the integrity of a product is provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 10A is a cross-sectional view of the electronic apparatus according to another embodiment of the present disclosure in a state in which the movable member is further exposed from the housing portion, FIG. 10B is a cross-sectional view taken along the line N-N of FIG. 10A, and FIG. 10C is an explanatory diagram of the housing portion in the electronic apparatus according to another embodiment of the present disclosure shown in FIG. 10B as viewed from the back surface side;

FIG. 13 is a cross-sectional view of the keyboard according to the embodiment of the present disclosure, which is taken along the line S-S of FIG. 11 and shows a state in which a frame member and a base member of the keyboard are separated from each other;

FIG. 14A is a cross-sectional view taken along the line S-S of FIG. 11, FIG. 14B is a cross-sectional view showing main parts of the frame member and the key input portion of the keyboard according to the embodiment of the present disclosure shown in FIG. 14A, and FIG. 14C is a cross-sectional view showing main parts of a fixing portion of the base member in the keyboard according to the embodiment of the present disclosure shown in FIG. 14A;

DETAILED DESCRIPTION OF EMBODIMENTS

Hereinafter, an electronic apparatus and a keyboard according to embodiments of the present disclosure will be described with reference to FIGS. 1 to 16. Note that, the same components are denoted by the same reference symbols in the figures. Further, the present disclosure is not limited to the following embodiments.

Note that, descriptions will be made in the following order.
1. Configuration example of electronic apparatus
2. Operation example of movable portion in electronic apparatus
3. Another configuration example of movable portion in electronic apparatus
4. Configuration example of keyboard
5. Another configuration example of keyboard <1. Configuration Example of Electronic Apparatus>

First, a tablet personal computer (hereinafter, referred to as "tablet PC") being an electronic apparatus according to an embodiment of the present disclosure will be described with reference to FIGS. 1 and 2.

Figure 1:
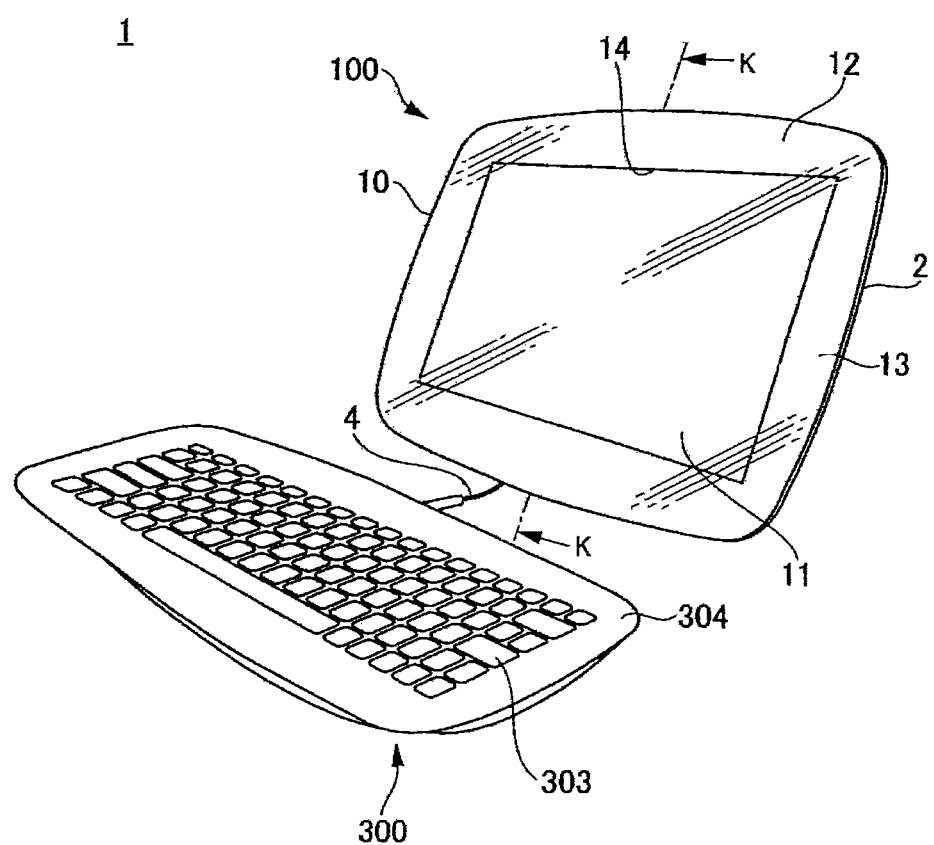
FIG. 1 is a perspective view showing an electronic apparatus and a keyboard according to an embodiment of the present disclosure.

FIG. 1 is a perspective view showing an electronic apparatus and a keyboard according to the embodiment of the present disclosure. FIG. 2 is a perspective view showing a state in which the electronic apparatus according to the embodiment of the present disclosure is separated into a main body portion and a back surface portion.

As shown in FIG. 1, an information processing apparatus 1 includes a tablet PC 100 and a keyboard main body 300. The tablet PC 100 is connected to the keyboard main body 300 via a wiring 4. Although, in the present disclosure, the tablet PC 100 is connected to the keyboard main body 300 via the wiring 4, the embodiment of the present disclosure is not limited thereto. For example, a main body portion 10 of the tablet PC 100 may be provided with a communication unit and this communication unit may be connected to be capable of sending and receiving information to/from an external apparatus in a wireless manner or the like. Further, a mouse and a printer are exemplified as the external apparatus other than the keyboard.

Figure 2:
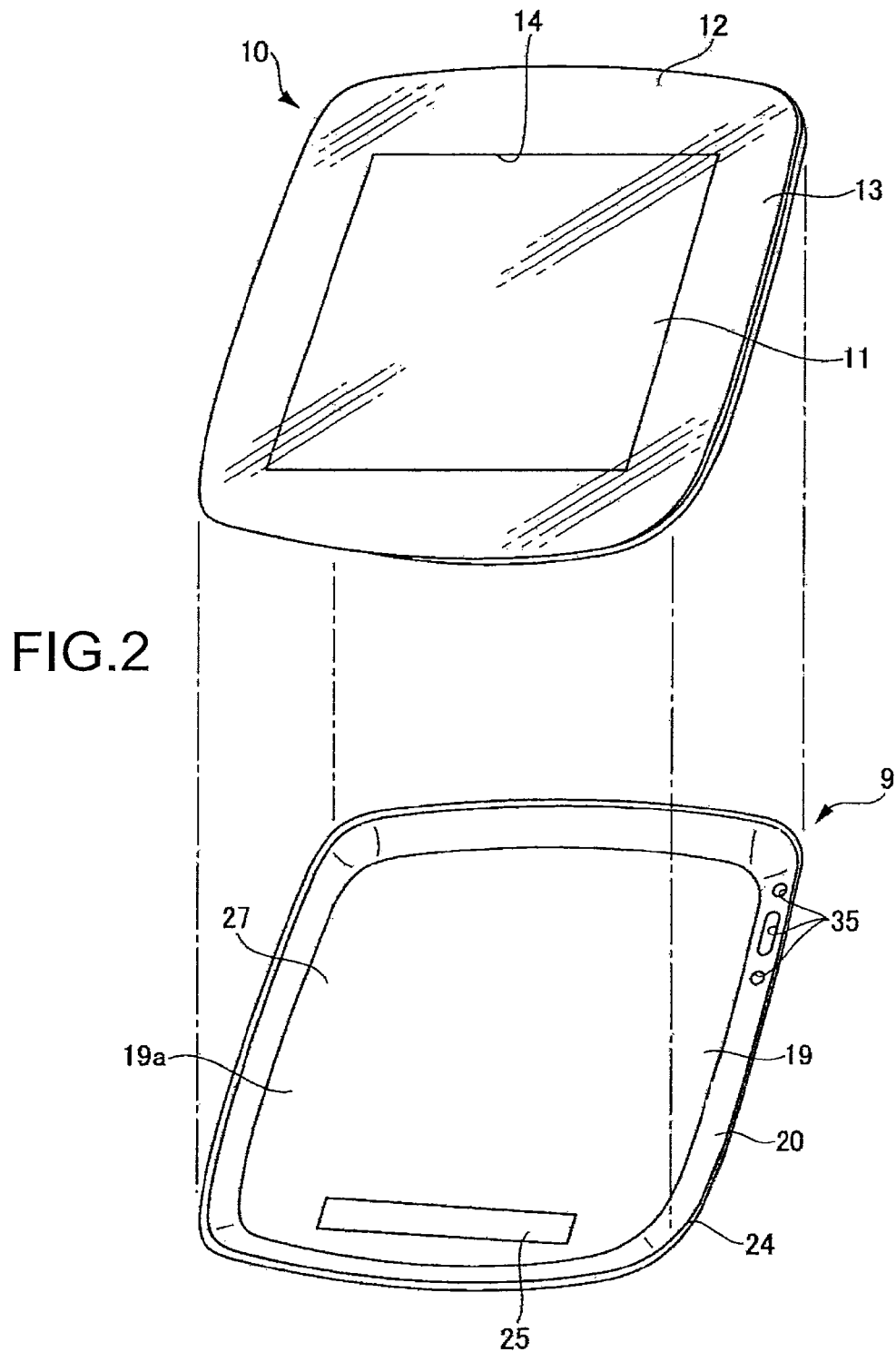
FIG. 2 is a perspective view showing a state in which the electronic apparatus according to the embodiment of the present disclosure is separated into a main body portion and a back surface portion.

As shown in FIG. 2, the tablet PC 100 is constituted of the main body portion 10 and a back surface portion 9.

[Main Body Portion]

The main body portion 10 is formed in a flat, almost cuboid shape. A front surface 10a of the main body portion 10 is formed in an almost plane shape. To the front surface 10a of the main body portion 10, a front surface plate 12, which will be described later, is mounted. A back surface 10b of the main body portion 10 bulges at an almost center portion thereof toward the back surface portion 9. A side of the back surface 10b of the main body portion 10 is covered with the back surface portion 9 (see FIG. 5A). The main body portion 10 includes a display panel 11, the front surface plate 12, a cover member 13, a first light source 15, a second light source 16, and operation portions 17 (see FIG. 3).

Examples of the display panel 11 include a liquid-crystal display, an organic electro luminescence (EL) display, and a surface-conduction electron-emitter display. Although not shown in the drawings, on a side of the back surface portion 9 in the main body portion 10, a wiring substrate and the like installing a control apparatus that controls a screen of the display panel 11 are housed. Accordingly, various types of information can be displayed on the display panel 11.

Further, the display panel 11 includes a touch panel type input apparatus. Examples of the touch panel type input apparatus include various touch panel input apparatuses such as a resistive-film type and a capacitive type.

The front surface plate 12 is formed to be an almost rectangular, flat plate. The front surface plate 12 includes an opening portion 14 at a center thereof. The size of the opening portion 14 is set corresponding to the size of the display panel 11. In the opening portion 14 of the front surface plate 12, the display panel 11 is fixed via a frame member (not shown). Accordingly, the display panel 11 is exposed from the opening portion 14.

The cover member 13 is formed to be an almost rectangular, transparent, flat plate. The size of the cover member 13 is set corresponding to the size of the front surface plate 12. The cover member 13 covers the display panel 11 and the front surface plate 12. Accordingly, the cover member 13 can prevent the display panel 11 from being damaged and getting dirty.

Figure 3:
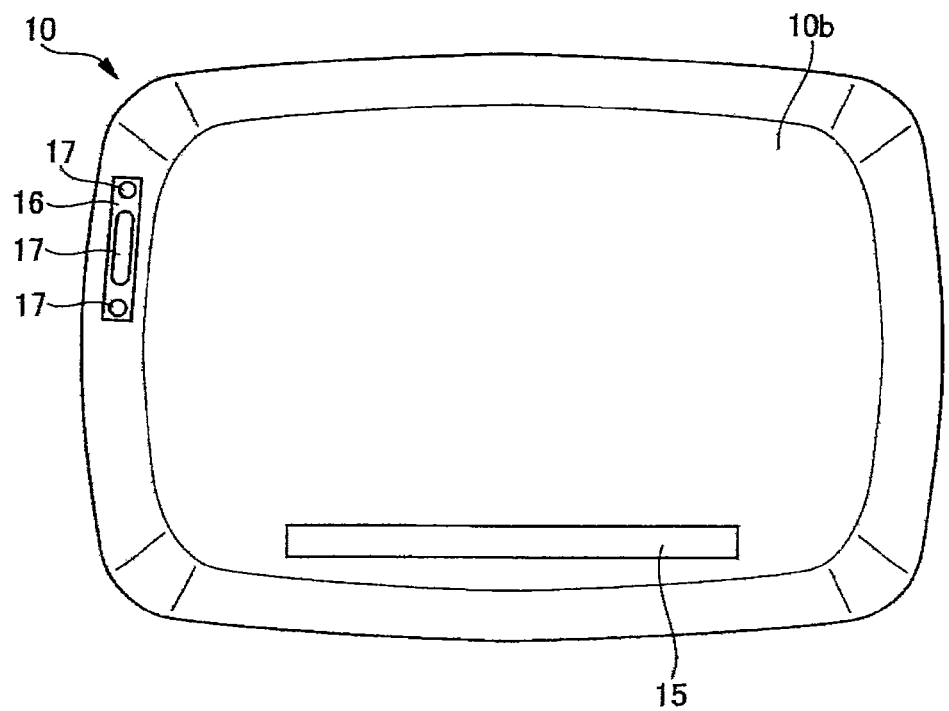
FIG. 3 is an explanatory diagram of a main body portion of the electronic apparatus according to the embodiment of the present disclosure as viewed from a back surface side.

As shown in FIG. 3, in the back surface 10b of the main body portion 10, the first light source 15 and the second light source 16 are provided. The first light source 15 and the second light source 16 emit light toward the back surface portion 9. The light emitted by the first light source 15 transmits through a light guide portion 25 of the back surface portion 9, which will be described later. Meanwhile, the light emitted by the second light source 16 transmits through the operation portions 17, which will be described later. As the first light source 15 and the second light source 16, various light sources such as a light-emitting diode are exemplified.

Although the first light source 15 and the second light source 16 are provided in the back surface 10b of the main body portion 10, the present disclosure is not limited thereto. The light emitted by the light source only needs to transmit through the light guide portion 25 or the operation portions 17. The positions of the light sources may be set corresponding to the light guide portion 25 and the operation portions 17.

The operation portions 17 are mounted to the second light source 16. The operation portions 17 are connected to a control apparatus of the main body portion 10 via wirings (not shown). The operation portions 17 have a function of operating a power-supply and a volume control of the tablet PC 100, for example.

To the operation portion 17, a press-type mechanical switch is applicable, for example. The operation portion 17 is constituted of a circular button switch, an almost ellipsoid button switch, or the like. When the operation portion 17 is pressed, information from the operation portion 17 is sent to the main body portion 10 as a signal. The main body portion 10 performs processing according to the signal received from the operation portion 17. As an input method for the operation portion 17, a touch panel method is exemplified other than the mechanical press button method.

Note that, although, in the tablet PC 100 according to the embodiment of the present disclosure, the operation portions 17 are provided to the main body portion 10, the present disclosure is not limited thereto. For example, the operation portions may be provided to the back surface portion 9.

[Back Surface Portion]

Next, the back surface portion 9 will be described with reference to FIGS. 2, 4 and 5A.

Figure 4:
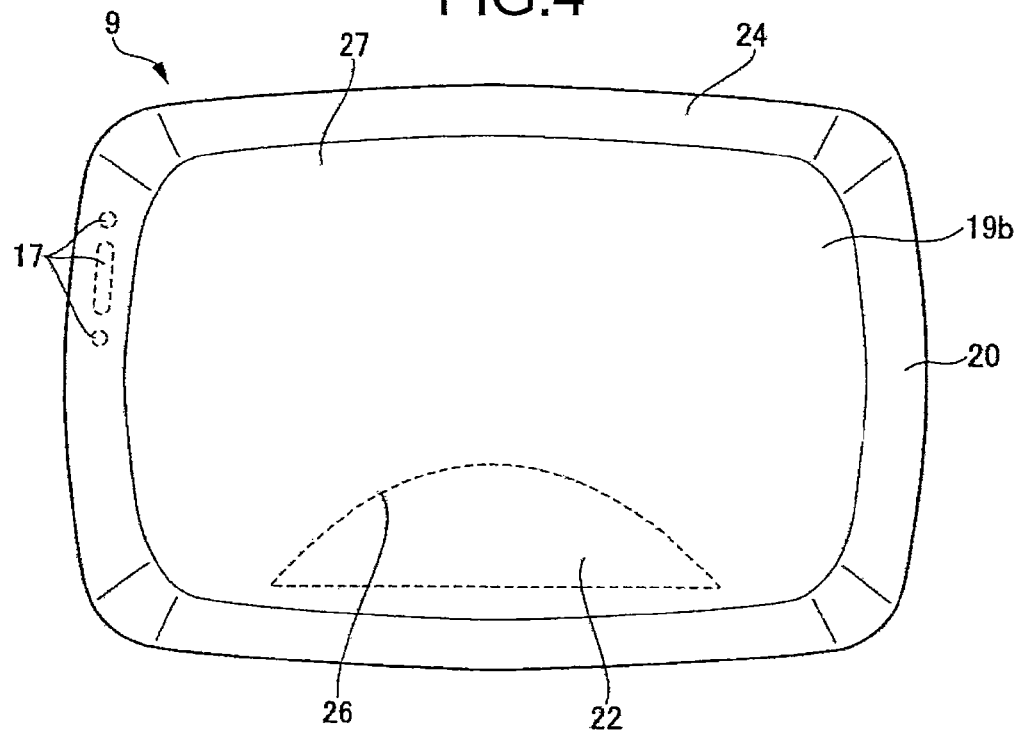
FIG. 4 is an explanatory diagram of the back surface portion of the electronic apparatus according to the embodiment of the present disclosure as viewed from a rear surface side.

FIG. 4 is an explanatory diagram showing a state of the back surface portion 9 in the electronic apparatus according to the embodiment of the present disclosure as viewed from a rear surface. FIG. 5A is a cross-sectional view taken along the line K-K of FIG. 1.

As shown in FIG. 2, the back surface portion 9 includes a back surface plate 19, a movable portion 22 (see FIG. 5A), and a back surface member 24. The back surface plate 19 is formed to be an almost rectangular, flat plate. As shown in FIG. 5A, the back surface plate 19 is provided on an opposite side of the display panel 11 in the main body portion 10. The back surface plate 19 is opposed to the back surface 10b of the main body portion 10. The back surface plate 19 is formed of an almost rectangular substrate portion 27 and a peripheral portion 20.

End portions of the substrate portion 27 are continuously provided with the peripheral portion 20. The peripheral portion 20 is connected to the substrate portion 27 with a predetermined angle. The back surface plate 19 is formed in an almost dish shape.

Further, as shown in FIG. 2, the peripheral portion 20 is provided with through-holes 35 penetrating through the peripheral portion 20. The through-holes 35 are arranged corresponding to positions of the operation portions 17 mounted to the main body portion 10. Into the through-holes 35, the operation portions 17 mounted to the main body portion 10 are inserted.

Figure 5A:
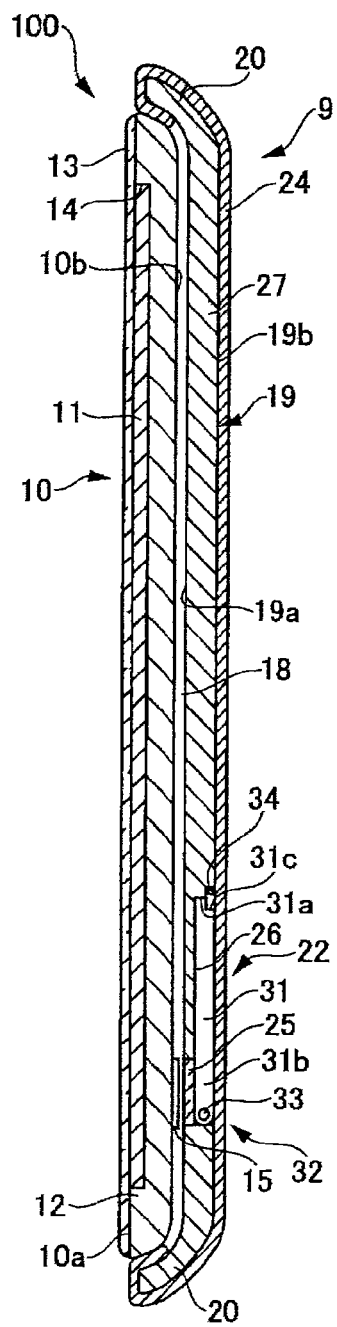
FIG. 5A is a cross-sectional view taken along the line K-K of FIG. 1 in a state in which a movable portion of the electronic apparatus according to the embodiment of the present disclosure is housed in a housing portion.

As shown in FIG. 5A, the substrate portion 27 and the peripheral portion 20 of the back surface plate 19 form a housing portion 18. The housing portion 18 houses the main body portion 10. At this time, the end portions of the peripheral portion 20 come close to end portions of the front surface plate 12.

The back surface plate 19 includes the light guide portion 25 and a housing portion 26. As shown in FIG. 2, the light guide portion 25 is formed of an almost rectangular, transparent, plate-like member. The light guide portion 25 is provided to the substrate portion 27. The light guide portion 25 is positioned on one end side of the substrate portion 27 in a lateral direction. Further, the light guide portion 25 is formed with a longitudinal direction thereof being along a longitudinal direction of the substrate portion 27.

As shown in FIG. 5A, the light guide portion 25 is opposed to the first light source 15 provided to the front surface plate 12. The light guide portion 25 guides the light emitted by the first light source 15 toward a rear surface 19b of the back surface plate 19.

As shown in FIG. 4, the housing portion 26 is positioned on one end side of the rear surface 19b of the back surface plate 19 in the lateral direction. As shown in FIG. 5A, the housing portion 26 is provided at a position in proximity to the light guide portion 25. Further, the housing portion 26 is formed to be recessed from the rear surface 19b of the back surface plate 19 to an opposite surface 19a. The housing portion 26 is provided from a center portion of the back surface plate 19 toward both end portions thereof in the longitudinal direction (see FIG. 4). The housing portion 26 houses the movable portion 22, which will be described later.

Next, the movable portion 22 will be described with reference to FIGS. 5A, 6, and 7.

Figure 6:
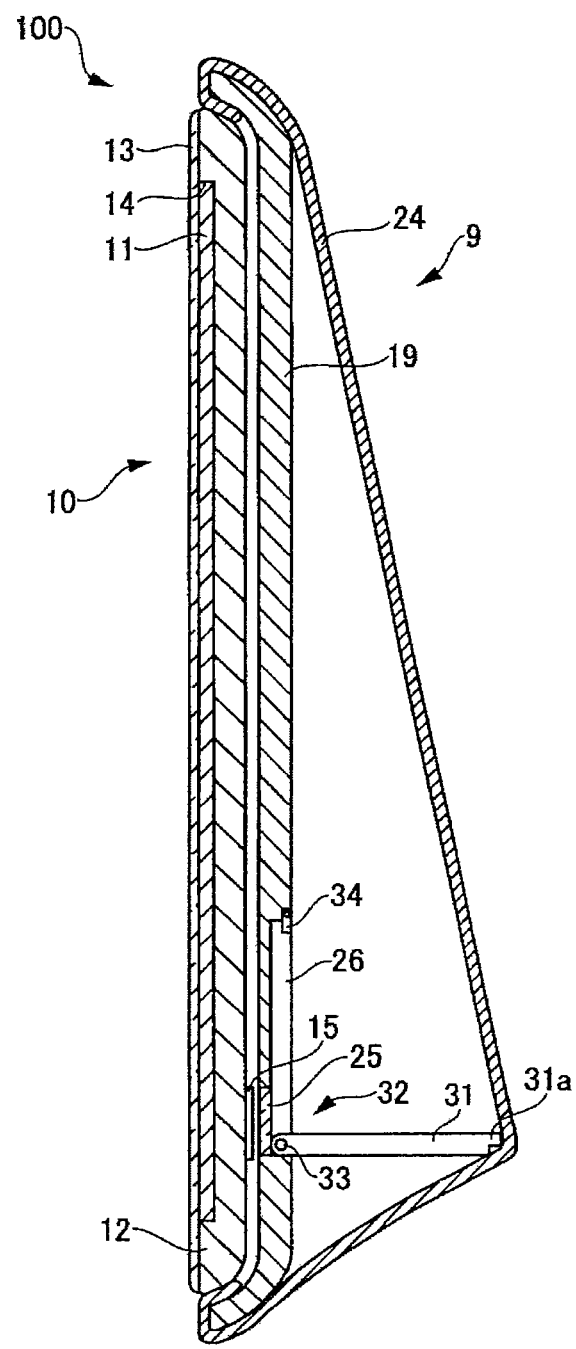
FIG. 6 is a cross-sectional view of the electronic apparatus according to the embodiment of the present disclosure, which is taken along the line K-K of FIG. 1.
Figure 7:
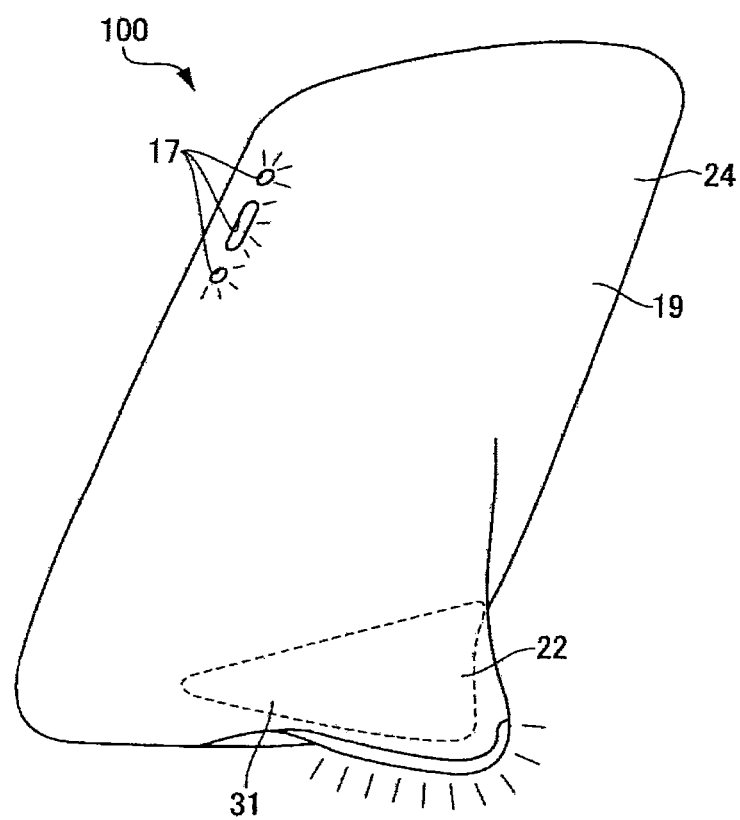
FIG. 7 is a perspective view of the electronic apparatus according to the embodiment of the present disclosure the posture of which is held by the movable portion as viewed from the back surface portion.

FIG. 6 is a cross-sectional view of the electronic apparatus according to the embodiment of the present disclosure, which is taken along the line K-K of FIG. 1. FIG. 7 is a perspective view of the electronic apparatus according to the embodiment of the present disclosure the posture of which is held by the movable portion as viewed from the back surface portion.

As shown in FIG. 5A, the movable portion 22 is housed in the housing portion 26 provided to the rear surface 19b of the back surface plate 19 as described above. The movable portion 22 is constituted of a movable member 31 and a rotation mechanism 32.

The movable member 31 is formed to be an almost-semi-circular, transparent, flat plate. The movable member 31 is housed in the housing portion 26, and hence the thickness of the movable member 31 is set to be almost equal to the depth of the housing portion 26. In an arc portion of the movable member 31, an outer edge portion 31a is formed. In a chord portion of the movable member 31, a base portion 31b is formed. In the base portion 31b of the movable member 31, a rotating shaft 33 is fixed.

The rotation mechanism 32 is constituted of, for example, a bearing portion (not shown) provided to the back surface plate 19, the rotating shaft 33, and an elastic member (not shown) attached to the rotating shaft 33 while being twisted. For the elastic member, for example, a coil spring is used. The rotating shaft 33 fixed to the movable member 31 is supported by the bearing portion to be rotatable. Accordingly, the movable member 31 rotates to move away from or closer to the rear surface 19b of the back surface plate 19 via the rotating shaft 33. Note that, when the movable member 31 is housed in the housing portion 26, the elastic member is housed while being twisted against an elastic force thereof.

Although, in the embodiment of the present disclosure, the bearing portion is provided to the back surface plate 19, the movable member 31 may be provided with the bearing portion and the rotating shaft 33 may be provided to the back surface plate 19.

The outer edge portion 31a of the movable member 31 is provided with a cutout portion 31c. The cutout portion 31c is engaged to a stopper 34 provided to the back surface portion 9. The stopper 34 is formed to be an almost rectangular, flat plate. The stopper 34 abuts against the outer edge portion 31a of the movable member 31, so that the rotation of the movable member 31 can be limited. By limiting the rotation of the movable member 31, the movable member 31 is not exposed from the housing portion 26 and the movable member 31 can be surely housed in the housing portion 26.

Note that, the stopper 34 can be released by various methods. For example, a configuration in which, when a user presses the stopper 34, the stopper 34 is released from the cutout portion 31c and the movable member 31 rotates may be employed. Alternatively, as another example, a configuration in which driving of a motor releases the stopper 34 and the movable member 31 automatically rotates may be employed. Further, an operation of the movable portion 22 will be described later in detail.

As shown in FIG. 6, when the stopper 34 is released, the twisted and attached elastic member biases the movable member 31 in a direction away from the back surface plate 19. By the elastic member biasing the movable member 31 in the direction away from the back surface plate 19, the movable member 31 rotates in the direction away from the back surface plate 19 via the rotating shaft 33. The rotation mechanism 32 moves the outer edge portion 31a of the movable member 31 away from the back surface plate 19. Then, the rotation mechanism 32 rotates the movable member 31 until the movable member 31 is orthogonal to the back surface plate 19. Accordingly, as shown in FIG. 7, the movable portion 22 serves as a stand that holds postures of the main body portion 10 and the back surface portion 9.

Further, when the user moves the movable member 31 closer to the back surface plate 19 against the elastic force of the elastic member, the movable member 31 is housed in the housing portion 26 (see FIG. 5A). Accordingly, the movable member 31 does not project from the rear surface 19b of the back surface plate 19 and it is possible to form a flat surface without irregularities in the back surface portion 9.

Further, the movable member 31 is formed of a light-transmitting member. The light emitted by the first light source 15 transmits through the light guide portion 25 and also the movable member 31. Therefore, this light serves as light indicating an end portion of the movable portion 22. Further, the light emitted by the second light source 16 transmits through the operation portions 17. Therefore, such light serves as light indicating positions of the operation portions 17.

Next, the back surface member 24 will be described with reference to FIGS. 5A and 5B and 7.

Figure 5B:
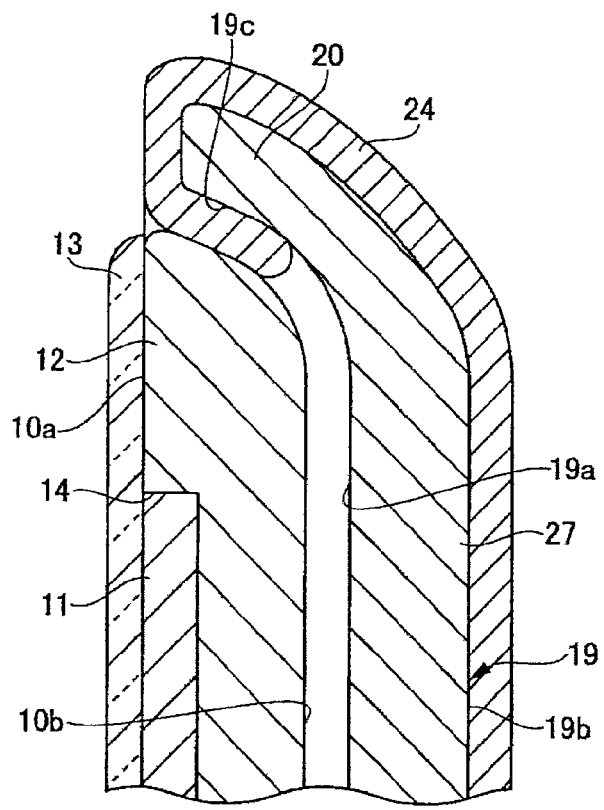
FIG. 5B is a cross-sectional view showing main parts of a peripheral portion of the back surface portion of the electronic apparatus according to the embodiment of the present disclosure shown in FIG. 5A.

FIG. 5B is a cross-sectional view showing main parts of the peripheral portion of the back surface portion in the electronic apparatus according to the embodiment of the present disclosure.

The back surface member 24 is a member excellent in stretch properties and flexibility. For the back surface member 24, polyurethane or a silicone rubber may be used, for example. As shown in FIGS. 5A and 7, the back surface member 24 transmits therethrough the light emitted by the first light source 15 and the second light source 16. Note that, in order to transmit the light emitted by the first light source 15 and the second light source 16, the back surface member 24 is favorably a translucent member.

The back surface member 24 covers the rear surface 19b of the back surface plate 19, the movable portion 22, and the operation portions 17 exposed from the back surface plate 19. As shown in FIG. 5B, the back surface member 24 is wrapped from the rear surface 19b of the back surface plate 19 to the opposite surface 19a of the back surface plate 19. Further, end portions of the back surface member 24 are fixed to end portions 19c of the opposite surface 19a of the back surface plate 19. Further, the end portions of the back surface member 24 are sandwiched between the main body portion 10 and the back surface portion 9. Accordingly, it is possible to strongly fix the back surface member 24 to the back surface portion 9. Note that, as the fixing method for the back surface member 24, for example, an adhesive or pressure bonding is used.

The back surface member 24 covers the rear surface 19b of the back surface plate 19. Therefore, the movable portion 22 provided to the rear surface 19b of the back surface plate 19 and the operation portions 17 exposed from the rear surface 19b of the back surface plate 19 can be hidden by the back surface member 24. Accordingly, a parting line and a seam between parts of the back surface portion 9 can be hidden. Thus, it is possible to provide a tablet PC having a seamless appearance. Further, by forming the back surface member 24 to be sufficiently thin, the user can operate the main body portion 10 using the operation portions 17 even if the operation portions 17 are of touch panel type.

Further, the end portions of the back surface member 24 are wrapped around and fixed to the opposite surface 19a of the back surface plate 19. Accordingly, a tensile force acts on the back surface member 24, and the back surface member 24 stretches or retracts following movement of the movable portion 22. As a result, the appearance of the back surface portion 9 can be formed in a smooth curved surface shape. Further, the back surface member 24 is wrapped around and fixed to the opposite surface 19a of the back surface plate 19, and hence an appropriate tensile force acts on the back surface member 24. Thus, the back surface member 24 does not easily wrinkle. In addition, the end portions of the main body portion 10 and the end portions of the peripheral portion 20 come close to each other, and hence a seam visible to the user can be minimized. Accordingly, the integrity is ensured between the main body portion 10 and the back surface portion 9.

Here, in a traditional tablet PC, in order to hold its posture, the stand being a separate member is separately mounted. In contrast, in the tablet PC 100 according to the embodiment of the present disclosure, the movable portion 22 that serves as the stand is mounted to the back surface portion 9 in advance. Further, the movable portion 22 is housed in the housing portion 26 provided to the back surface portion 9. As a result, it becomes unnecessary to separately mount the stand that holds the posture of the tablet PC 100. Further, the back surface portion 9 is covered with the back surface member 24. Therefore, the movable portion 22 can be hidden by the back surface member 24, and hence it is possible to provide the tablet PC 100 looked as if it did not have the stand.

Note that, a surface of the back surface member 24 may be coated with a coating for protecting the back surface member 24. For example, a water-repellent coating or an antifouling coating may be applied.

Although, in the embodiment of the present disclosure, the example in which the tablet personal computer is applied as an example of the electronic apparatus has been described, the present disclosure is not limited thereto. For example, there are a mobile terminal and a television receiver as other examples of the electronic apparatus.

Although, in the embodiment of the present disclosure, the example in which the movable portion 22 is applied as the stand has been described, the present disclosure is not limited thereto. For example, the movable portion 22 may also be applied to the grip portion.

<2. Operation Example of Movable Portion in Electronic Apparatus>

Next, an operation example of the movable portion 22 in the tablet PC 100 will be described with reference to FIGS. 5A and 5B to 7.

As shown in FIG. 5A, first, the housing portion 26 in the back surface plate 19 houses the movable portion 22. At this time, the back surface member 24 is held in close contact with the rear surface 19b of the back surface plate 19.

Then, for example, the user depresses the stopper 34. Then, the stopper 34 is released and the movable member 31 biased by the elastic member (not shown) rotates. At this time, along with the rotation of the movable member 31, the back surface member 24 is pressed and stretched by the movable member 31.

The movable member 31 rotates while pressing the back surface member 24 until the movable member 31 is orthogonal to the back surface plate 19. Accordingly, the movable portion 22 serves as the stand that holds the postures of the main body portion 10 and the back surface portion 9. By being supported by the movable portion 22, the tablet PC 100 can hold its posture.

Further, by the user upwardly pressing the movable member 31 against the elastic force of the elastic member, the movable member 31 rotates. The rotating movable member 31 is housed in the housing portion 26.

Note that, although the movable portion 22 serves as the stand that holds the postures of the main body portion 10 and the back surface portion 9 by the movable member 31 being orthogonal to the back surface plate 19, the present disclosure is not limited thereto. For example, by providing a lock mechanism to the movable portion 22 and limiting an angle of the movable member 31 with respect to the back surface plate 19 by the lock mechanism, the postures of the main body portion 10 and the back surface portion 9 may be changed in two or more stages. Further, the movable portion 22 can be applied as a grip portion.

Although, in the embodiment of the present disclosure, the coil spring is exemplified as the elastic member, another spring may be used.

In addition, a configuration in which driving of the motor rotates the rotating shaft 33 and the movable member 31 automatically rotates may be employed.

<3. Another Configuration Example of Movable Portion in Electronic Apparatus>

Another example of the movable portion in the electronic apparatus according to the embodiment of the present disclosure will be described with reference to FIGS. 8A to 10C.

Figure 8A:
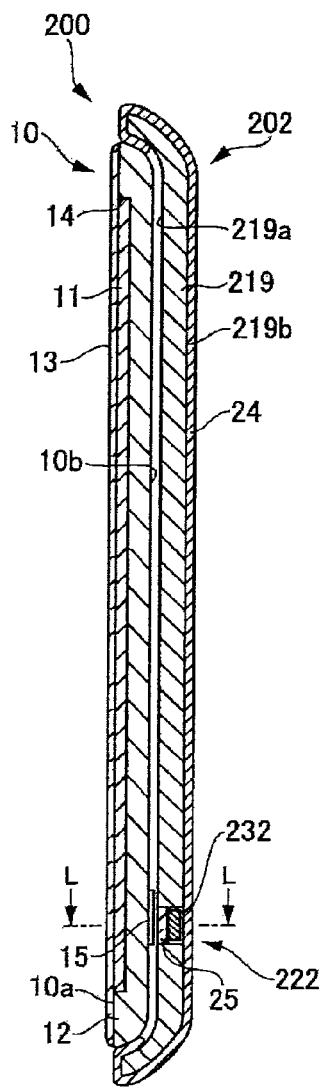
FIG. 8A is a cross-sectional view of an electronic apparatus according to another embodiment of the present disclosure.
Figure 8B:
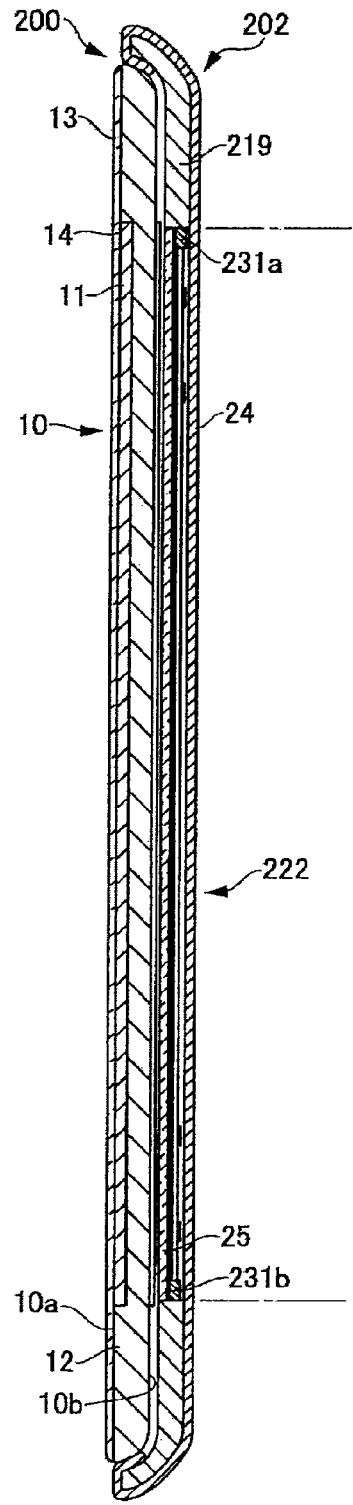
FIG. 8B is a cross-sectional view taken along the line L-L of FIG. 8A.
Figure 8C:
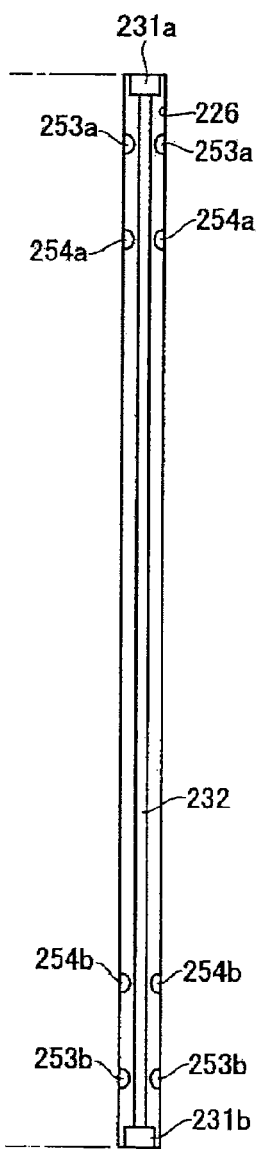
FIG. 8C is an explanatory diagram of a housing portion in the electronic apparatus according to another embodiment of the present disclosure shown in FIG. 8B as viewed from a back surface side.
Figure 9A:
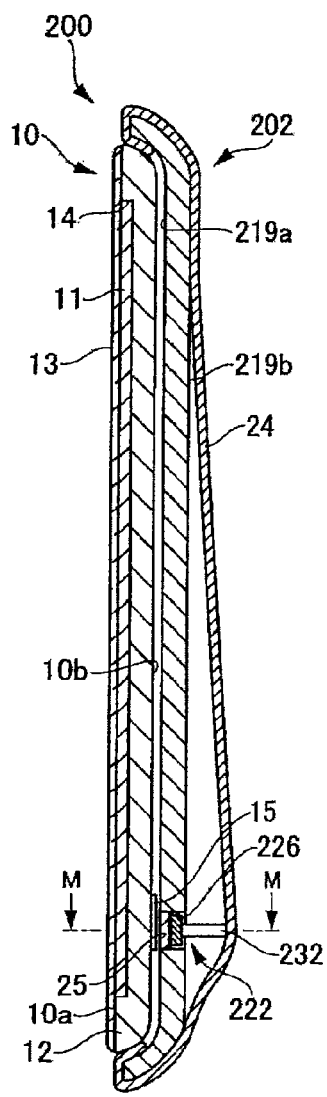
FIG. 9A is a cross-sectional view of the electronic apparatus according to another embodiment of the present disclosure in a state in which a movable member is exposed from the housing portion.
Figure 9B:
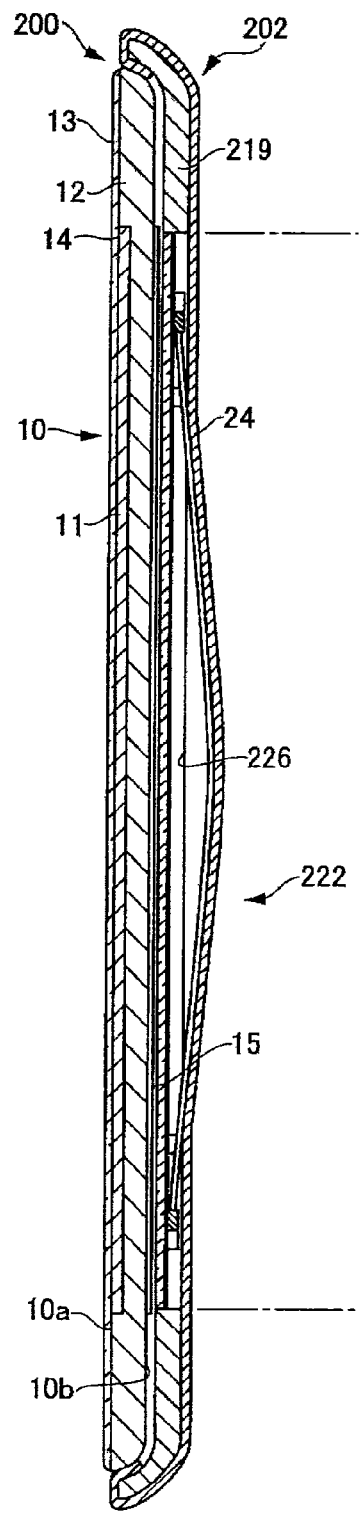
FIG. 9B is a cross-sectional view taken along the line M-M of FIG. 9A.
Figure 9C:
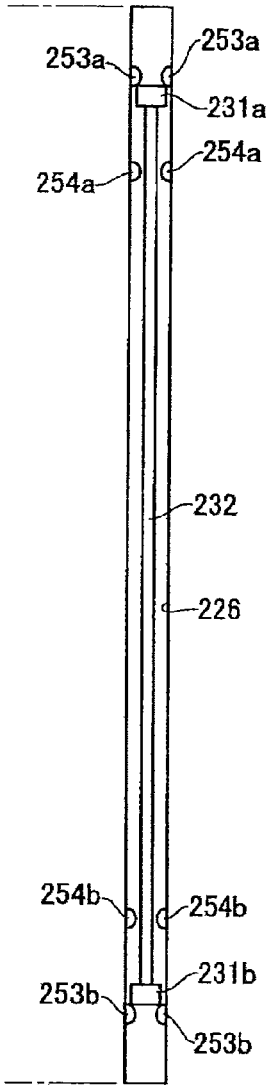
FIG. 9C is an explanatory diagram of the housing portion in the electronic apparatus according to another embodiment of the present disclosure shown in FIG. 9B as viewed from the back surface side.

FIGS. 8A to 8C are cross-sectional views of an electronic apparatus according to another embodiment of the present disclosure. FIGS. 9A to 9C are cross-sectional views of the electronic apparatus according to another embodiment of the present disclosure in a state in which a movable member is exposed from a housing portion. FIGS. 10A to 10C are cross-sectional views of the electronic apparatus according to another embodiment of the present disclosure in a state in which the movable member is further exposed from the housing portion.

A tablet PC 200 according to another embodiment is different from the tablet PC 100 according to the above-mentioned embodiment in movable portion. Here, matters relating to the movable portion will be described and descriptions of portions common to the tablet PC 100 according to the above-mentioned embodiment will be omitted.

As shown in FIG. 8A, the tablet PC 200 includes a main body portion 10 and a back surface portion 202. The back surface portion 202 includes a back surface plate 219, a movable portion 222, a guide portion 226, and a back surface member 24. The back surface plate 219 is opposed to the back surface 10b of the main body portion 10.

The guide portion 226 is provided at a position in proximity to a light guide portion 25 in a rear surface 219b of the back surface plate 219. The guide portion 226 is a groove portion formed to be recessed from the rear surface 219b of the back surface plate 219 to the opposite surface 219a. The guide portion 226 is formed to extend along the longitudinal direction of the back surface plate 219. The guide portion 226 houses the movable portion 222, which will be described later, and hence the guide portion 226 is formed to have a size corresponding to the size of the movable portion 222.

Further, in wall surfaces of the guide portion 226, first protrusion portions 253a and 253b and second protrusion portions 254a and 254b are provided. The first protrusion portions 253a and 253b are arranged outside with respect to the second protrusion portions 254a and 254b in a direction in which the guide portion 226 extends. The first protrusion portions 253a and 253b and the second protrusion portions 254a and 254b are adjusters that adjust positions of sliders 231a and 231b within the guide portion 226, which will be described later. Note that, although, in the embodiment of the present disclosure, the two pair of protrusion portions that serve as the adjusters are provided, the number of protrusion portions is not limited. That is, only a pair of protrusion portions may be provided or three or more pairs of protrusion portions may be provided.

The movable portion 222 is housed in the guide portion 226. The movable portion 222 is constituted of the sliders 231a and 231b and a wire 232.

The slider 231a is provided at one end in the direction in which the guide portion 226 extends, while the slider 231b is provided at the other end in the direction in which the guide portion 226 extends. The sliders 231a and 231b are each formed of an almost rectangular, flat plate member and supported by the guide portion 226. The sliders 231a and 231b are movable along the direction in which the guide portion 226 extends.

The sliders 231a and 231b are arranged in the guide portion 226, and hence the thickness of the sliders 231a and 231b is set to be almost equal to the depth of the guide portion 226. The slider 231a and the slider 231b are connected through the wire 232.

The wire 232 is formed of, for example, a piano wire. The length of the wire 232 is almost equal to the length of the guide portion 226 from one end to the other end in the direction in which the guide portion 226 extends.

As shown in FIG. 9C, when the user moves the sliders 231a and 231b located at the both end portions of the guide portion 226 to a center portion in the direction in which the guide portion 226 extends, the sliders 231a and 231b climb over the first protrusion portions 253a and 253b. At this time, the wire 232 bends and projects to an opposite side of the main body portion 10. The wire 232 presses and stretches the back surface member 24.

On the other hand, the back surface member 24 presses the wire 232 with a retraction force thereof acting on the wire 232. When the wire 232 is pressed by the back surface member 24, the sliders 231a and 231b move toward the both end portions. At this time, the sliders 231a and 231b abut against the first protrusion portions 253a and 253b. Accordingly, movement of the sliders 231a and 231b beyond the first protrusion portions 253a and 253b toward the both end portions in the direction in which the guide portion 226 extends is limited.

At this time, the wire 232 is shaped in a first form in which the wire 232 slightly projects from the back surface plate 219. In the first form, the user can grip the movable portion 222. Therefore, the movable portion 222 serves as a grip portion gripped by the user.

As shown in FIG. 10C, when the user further moves the sliders 231a and 231b abutting against the first protrusion portions 253a and 253b to the center portion in the direction in which the guide portion 226 extends, the sliders 231a and 231b climb over the second protrusion portions 254a and 254b. At this time, the wire 232 further bends and projects to the opposite side of the main body portion 10. The wire 232 presses and stretches the back surface member 24.

On the other hand, the back surface member 24 presses the wire 232 with the retraction force thereof acting on the wire 232. When the wire 232 presses the back surface member 24, the sliders 231a and 231b move toward the both end portions. At this time, the sliders 231a and 231b abut against the second protrusion portions 254a and 254b. Accordingly, from movement of the sliders 231a and 231b beyond the second protrusion portions 254a and 254b toward the both end portions in the direction in which the guide portion 226 extends is limited.

At this time, the wire 232 is shaped in a second form in which the wire 232 largely projects from the back surface plate 219. In the second form, the movable portion 222 largely projects, and hence the movable portion 222 serves as a stand that holds postures of the main body portion 10 and the back surface portion 202 together with the back surface member 24.

Note that, although, in the embodiment of the present disclosure, the example in which the sliders are moved by the hand of the user has been described, a configuration in which driving of a motor automatically moves the sliders 231a and 231b may be employed.

The other configurations are the same as those of the tablet PC 100 according to the above-mentioned embodiment, and hence descriptions thereof will be omitted. Also with the tablet PC 200 having the above-mentioned configuration, the same action and effect as those of the tablet PC 100 according to the above-mentioned embodiment can be obtained.

<4. Configuration Example of Keyboard>

Next, the keyboard main body 300 will be described with reference to FIGS. 11 to 14C.

Figure 11:
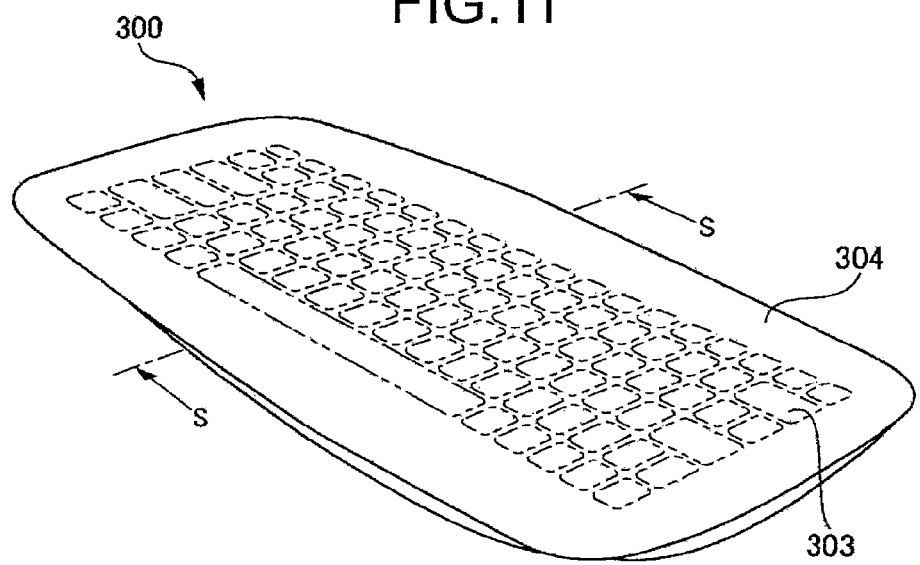
FIG. 11 is a perspective view showing a state in which a keyboard according to the embodiment of the present disclosure is powered off.
Figure 12:
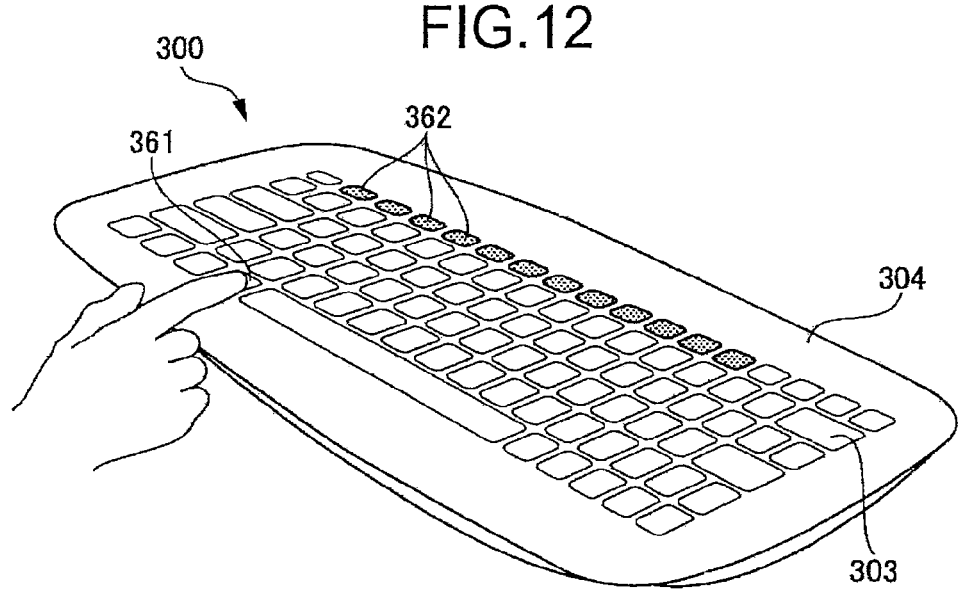
FIG. 12 is an explanatory diagram showing a state in which one key in a key input portion of the keyboard according to the embodiment of the present disclosure is pressed while a display of other keys is changed.

FIG. 11 is a perspective view showing a state in which the keyboard according to the embodiment of the present disclosure is powered off. FIG. 12 is an explanatory diagram showing a state in which one key input portion of the keyboard according to the embodiment of the present disclosure is pressed while a display of other key input portions is changed.

Further, FIG. 13 is a cross-sectional view of the keyboard according to the embodiment of the present disclosure, which is taken along the line S-S of FIG. 11 and shows a state in which a frame member and a base member of the keyboard are separated from each other. FIG. 14 is a cross-sectional view of the keyboard according to the embodiment of the present disclosure, which is taken along the line S-S of FIG. 11.

[Keyboard Main Body]

As shown in FIG. 11, the keyboard main body 300 is formed in a flat, almost cuboid shape. As shown in FIGS. 13 and 14B, the keyboard main body 300 includes a frame member 301, a base member 302, a key input portion 303, and a front surface member 304.

[Frame Member]

Next, the frame member 301 will be described with reference to FIGS. 11, 13, and 14A to 14C.

As shown in FIG. 13, the frame member 301 includes an upper surface plate 311 that serves as an operation surface portion and a lower surface plate 317 that serves as a lower surface portion. The upper surface plate 311 is formed to be an almost rectangular, flat plate. The upper surface plate 311 is provided with a plurality of holes 311a (see FIG. 14B).

On an opposite side of the upper surface plate 311 in the frame member 301, the lower surface plate 317 is provided. The lower surface plate 317 is provided with a connecting portion 312, a fixing portion 313, and a mounting portion 314. The mounting portion 314 is formed to be recessed in an almost rectangular shape at a center portion of the lower surface plate 317. Into the mounting portion 314, the base member 302 is fitted.

In an outer periphery of the mounting portion 314, the fixing portion 313 is provided. The fixing portion 313 is continuous with a bottom portion 314a of the mounting portion 314 and almost perpendicular to the bottom portion 314a on an opposite side of the upper surface plate 311. The fixing portion 313 is connected to an end portion of the upper surface plate 311 via the connecting portion 312.

In an opening 314b of the bottom portion 314a of the mounting portion 314, the key input portion 303 is inserted. The key input portion 303 is fixed to the mounting portion 314. The key input portion 303 is constituted of a plurality of keys. When the user performs an input through the key input portion 303, a control signal is inputted from the key input portion 303 into the tablet PC 100. In the tablet PC 100, predetermined information processing or the like is performed according to the inputted control signal.

Each of the keys includes a base end portion 336 and a tip end portion 338. The base end portion 336 is formed in an almost cuboid shape. Further, the tip end portion 338 is provided to project from the base end portion 336 while being continuous with and almost perpendicular to the base end portion 336. The tip end portion 338 is inserted into one of the plurality of holes 311a of the upper surface plate 311. A tip end surface 338a of the tip end portion 338 is set to be flush with an operation surface 311c being a surface of the upper surface plate 311 on an opposite side of the bottom portion 314a of the mounting portion 314. Accordingly, the tip end surface 338a of the tip end portion 338 and the operation surface 311c of the upper surface plate 311 can form a flat surface without irregularities. The tip end surface 338a and the operation surface 311c form the flat surface, and hence when the user carries the keyboard main body 300, the tip end portion 338 is prevented from catching on clothing and the like.

Although, in the embodiment of the present disclosure, the tip end surface 338a of the tip end portion 338 and the operation surface 311c of the upper surface plate 311 are set to be flush with each other, the tip end surface 338a may project with respect to the operation surface 311c.

[Front Surface Member]

Next, the front surface member 304 will be described with reference to FIGS. 13 and 14A to 14C.

The front surface member 304 is a member having stretch properties. For the front surface member 304, polyurethane or a silicone rubber may be used, for example. The front surface member 304 transmits therethrough light emitted by an illumination portion 325. Note that, in order to transmit the light emitted by the illumination portion 325, the front surface member 304 is more favorably a translucent member.

As shown in FIGS. 13 and 14A, the front surface member 304 covers the operation surface 311c of the upper surface plate 311. The front surface member 304 covers the connecting portion 312 from the operation surface 311c. As shown in FIG. 14C, in addition, end portions 304a of the front surface member 304 are wrapped around the fixing portion 313 and the bottom portion 314a of the mounting portion 314. The end portions 304a of the front surface member 304 are sandwiched between the frame member 301 and the base member 302. Accordingly, it is possible to strongly fix the front surface member 304 to the frame member 301. The front surface member 304 is fixed to the fixing portion 313 with an adhesive or the like as in the back surface member 24 of the main body portion 10.

Although, in the embodiment of the present disclosure, the example in which the front surface member 304 is fixed with the adhesive has been shown, the present disclosure is not limited thereto. For example, the front surface member 304 may be fixed by various fixing methods in addition to pressure bonding.

Note that, a surface of the front surface member 304 may be coated with a coating for protecting the front surface member 304. For example, a water-repellent coating or an antifouling coating may be applied.

In the embodiment of the present disclosure, the front surface member 304 is covered with the operation surface 311c of the upper surface plate 311. Thus, it is possible to prevent dust and foreign particles from entering gaps between the tip end portions 338 of the key input portion 303 and the plurality of holes 311a provided in the upper surface plate 311. As a result, dust and foreign particles are not accumulated within the keyboard main body 300. Further, the front surface member 304 is fixed to the frame member 301, and hence it is possible to integrally form the frame member 301 and the key input portion 303 without seams. Therefore, it is possible to see the frame member 301 and the key input portion 303 as a single member in appearance. In addition, the front surface member 304 is wrapped around and fixed to the fixing portion 313, and hence an appropriate tensile force acts on the front surface member 304, which makes it unlikely that the front surface member 304 will wrinkle.

[Base Member]

Next, the base member 302 will be described with reference to FIGS. 1, 13, and 15.

Figure 15:
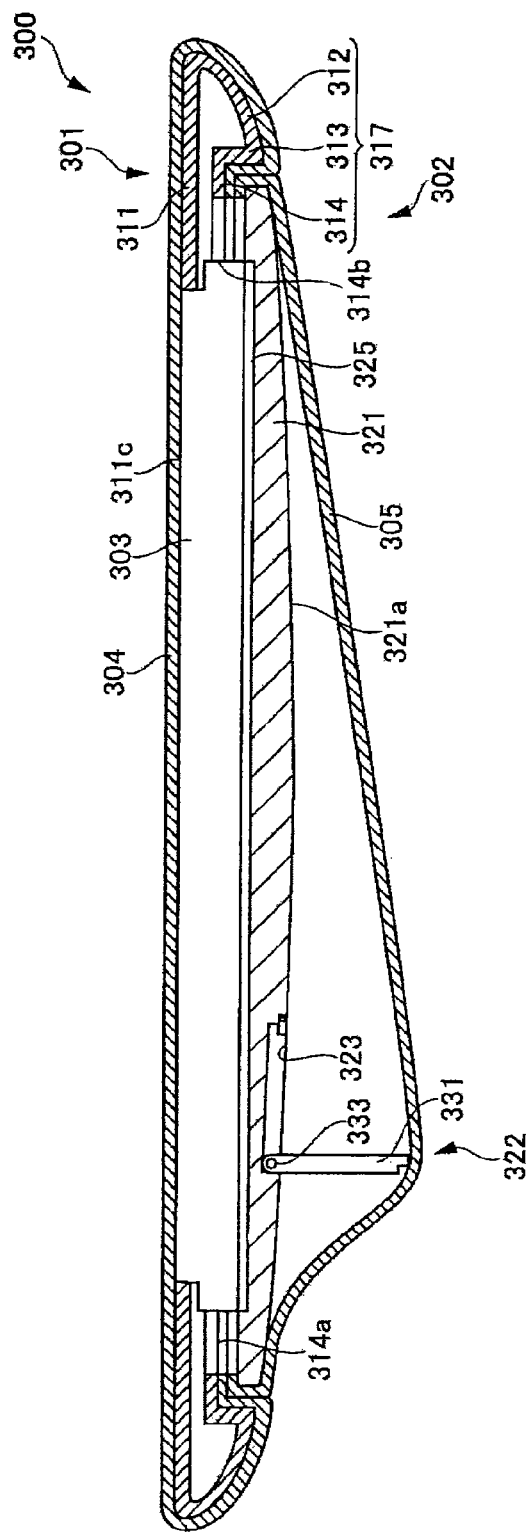
FIG. 15 is a cross-sectional view showing a state in which a variable portion of the keyboard according to the embodiment of the present disclosure is moved from the base member.

FIG. 15 is a cross-sectional view showing a state in which a variable portion of the keyboard according to the embodiment of the present disclosure is moved from the base member.

As shown in FIG. 13, the base member 302 includes a bottom plate 321, a variable portion 322, an accommodation portion 323, and a bottom surface member 305. The bottom plate 321 is formed to be an almost rectangular, flat plate. At a center of an upper surface 321b of a bottom plate, a recess portion 321c is provided. The illumination portion 325 is embedded in recess portion 321c.

The illumination portion 325 emits light to the key input portion 303. The light emitted by the illumination portion 325 transmits through the tip end portion 338 of the key input portion 303. Accordingly, the plurality of keys as shown in FIG. 1 are displayed.

Further, in a bottom surface 321a of the bottom plate 321 of the base member 302, the accommodation portion 323 is provided. The accommodation portion 323 is formed to be recessed from the bottom surface 321a of the bottom plate 321 toward the upper surface 321b. The accommodation portion 323 accommodates the variable portion 322.

The variable portion 322 is constituted of a variable member 331 and a rotating portion 332. The variable member 331 is formed of an almost rectangular, flat plate. The variable member 331 is accommodated in the accommodation portion 323, and hence the thickness of the variable member 331 is set to be almost equal to the depth of the accommodation portion 323. Accordingly, the variable member 331 does not project from the base member 302 and it is possible to form the bottom surface 321a of the base member 302 to have a flat shape.

Further, a rotating shaft 333 is fixed to the variable member 331. For example, the rotating portion 332 is constituted of a bearing portion (not shown) provided to the bottom plate 321, the rotating shaft 333, and an elastic member (not shown) attached to the rotating shaft 333 while being twisted. The rotating shaft 333 is supported by the bearing portion to be rotatable.

As shown in FIG. 15, by the elastic member (not shown) biasing the movable member 31 in a direction away from the bottom plate 321, the variable member 331 rotates via the rotating shaft 333. The rotating portion 332 moves the variable member 331 away from the bottom plate 321. The rotating portion 332 rotates the variable member 331 until the variable member 331 is orthogonal to the bottom plate 321. Accordingly, the variable portion 322 serves as a stand that holds postures of the frame member 301 and the base member 302.

As shown in FIG. 13, in one end portion 331b of the variable member 331, a cutout portion 331c is provided. The cutout portion 331c is engaged to a lock portion 334 provided to the bottom plate 321. The lock portion 334 is formed to be an almost rectangular, flat plate.

The lock portion 334 abuts against the one end portion 331b of the variable member 331, and hence the rotation of the variable member 331 can be limited. By limiting the rotation of the variable member 331, it is possible to prevent the variable member 331 from falling out of the accommodation portion 323, and to surely accommodate the variable member 331 in the accommodation portion 323.

Note that, the lock portion 334 may be released by various methods. For example, a configuration in which, when the user presses the lock portion 334, the lock portion 334 is released from the cutout portion 331c and the variable member 331 rotates may be employed.

Further, as another example, a configuration in which driving of a motor releases the lock portion 334 and the variable member 331 automatically rotates may be employed. In addition, the variable member 331 may be rotated by a motor instead of the elastic force of the elastic member.

The bottom surface 321a of the bottom plate 321 of the base member 302 is covered with the bottom surface member 305. For the bottom surface member 305, polyurethane or a silicone rubber may be used, for example, as in the front surface member 304 described above. By using the same member as the front surface member 304 for the bottom surface member 305, the integrity is ensured between the frame member 301 and the base member 302. As a result, the esthetic appearance of the keyboard main body 300 is improved and a good appearance can be obtained.

The bottom surface member 305 covers from the bottom surface 321a to the upper surface 321b. End portions of the bottom surface member 305 are wrapped around and fixed to the upper surface 321b of the bottom plate. The end portions of the bottom surface member 305 are sandwiched between the frame member 301 and the base member 302. Accordingly, it is possible to strongly fix the bottom surface member 305 to the base member 302. Note that, as the fixing method for the bottom surface member 305, the same fixing method as the above-mentioned fixing method for the front surface member 304 may be used.

Further, the bottom surface member 305 covers the bottom surface 321a of the bottom plate 321, and hence it is possible to hide the variable portion 322 provided to the bottom surface 321a of the bottom plate 321. Accordingly, a seam between the base member 302 and the variable portion 322 can be hidden. In addition, the base member 302 is fixed to the mounting portion 314 of the lower surface plate 317. Thus, when the user uses the keyboard main body 300, the seam between the base member 302 and the frame member 301 can be made less noticeable to the user.

Note that, a surface of the bottom surface member 305 may be coated with a coating for protecting the bottom surface member 305. For example, a water-repellent coating or an antifouling coating may be applied.

Further, as shown in FIG. 1, when the keyboard main body 300 is powered on, the illumination portion 325 provided to the base member 302 of the keyboard main body 300, which will be described later, emits light to the key input portion 303 and the plurality of keys are displayed. When the keyboard main body 300 is powered off, as shown in FIG. 11, the plurality of keys are not displayed on the front surface member 304.

Further, as shown in FIG. 12, by pressing one key 361, for example, a function key, a display of other keys 362 different from the pressed key 361 can be changed. Examples of changing a display of keys include various other display methods such as changing the color of keys, selectively blinking keys, and displaying characters in keys.

Note that, a configuration in which the base member 302 is provided with a communication unit and the communication unit is connected so that information can be sent and received to/from an external apparatus in a wireless manner or the like may be employed. Further, examples of the external apparatus include a personal computer and a printer.

Further, this configuration of the keyboard main body 300 is applicable also to a folding laptop personal computer, for example.

<5. Another Configuration Example of Keyboard>

Next, another configuration example of the keyboard according to the embodiment of the present disclosure will be described with reference to FIG. 16.

Figure 16:
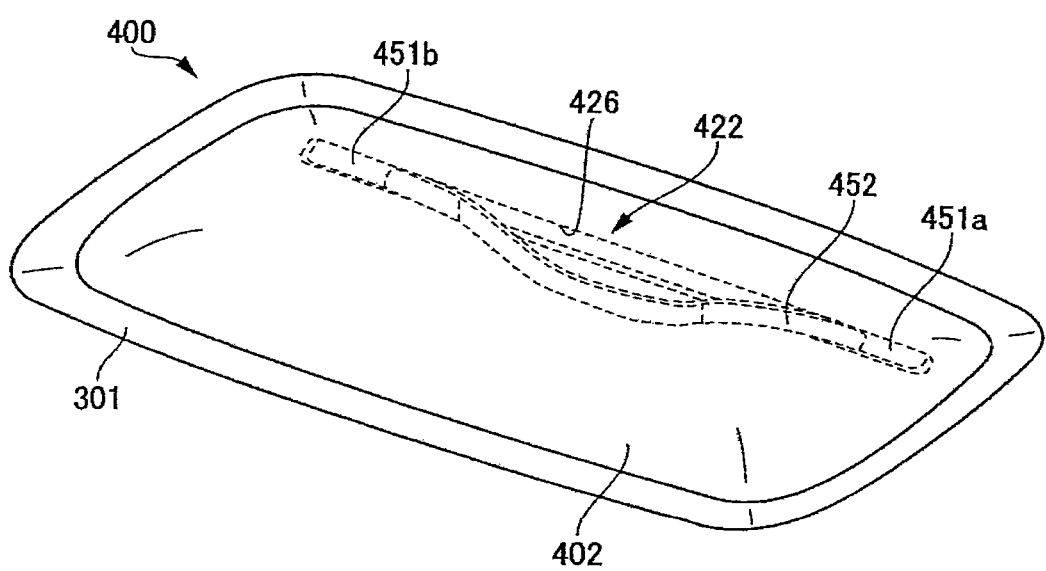
FIG. 16 is a perspective view of a keyboard according to another embodiment of the present disclosure as viewed from a base member side.

FIG. 16 is a perspective view of a keyboard according to another embodiment of the present disclosure as viewed from a base member side.

A keyboard main body 400 according to another embodiment is different from the keyboard main body 300 according to the above-mentioned embodiment in movable portion. Here, matters relating to the movable portion will be described and descriptions of portions common to the keyboard main body 300 according to the above-mentioned embodiment will be omitted.

As shown in FIG. 16, a base member 402 of the keyboard main body 400 is provided with a guide portion 426. The guide portion 426 is formed to extend along a longitudinal direction of the base member 402. In the guide portion 426, a variable portion 422 is provided. The variable portion 422 is constituted of sliders 451*a* and 451*b* and a wire 452. The sliders 451*a* and 451*b* are arranged at both ends in a direction in which the guide portion 426 extends. The wire 452 couples the sliders 451*a* and 451*b* to each other.

The wire 452 is formed of, for example, a piano wire. The length of the wire 452 is almost equal to the length of the guide portion 426 from one end to the other end in the longitudinal direction.

The sliders 451*a* and 451*b* move along a direction in which the guide portion 426 extends. At this time, the wire 452 bends and projects to an opposite side of the base member 402. The wire 452 presses and stretches the bottom surface member 30. Accordingly, the variable portion 422 serves as a stand that holds the frame member 301 and the base member 402.

The other configurations are the same as those of the keyboard main body 300 according to the above-mentioned embodiment, and hence descriptions thereof will be omitted. Also with the keyboard main body 400 having the above-mentioned configuration, the same action and effect as those of the keyboard main body 300 according to the above-mentioned embodiment can be obtained.

It should be noted that the present disclosure may also take the following configurations.

(1) An electronic apparatus, including:
　a main body portion that includes a display portion and is configured to process inputted information;
　a back surface portion configured to cover a back surface of the main body portion on an opposite side of the display portion;
　a movable portion that is mounted to a rear surface of the back surface portion on an opposite side of an opposite surface of the back surface portion, the opposite surface being opposed to the main body portion; and
　a back surface member that has stretch properties and is configured to cover the back surface portion and the movable portion.

(2) The electronic apparatus according to (1), in which
　the movable portion includes a stand configured to hold postures of the main body portion and the back surface portion.

(3) The electronic apparatus according to (2), in which
　the stand is configured to be capable of changing the postures of the main body portion and the back surface portion in at least two stages.

(4) The electronic apparatus according to any one of (1) to (3), further including
　an operation portion that is exposed from the rear surface of the back surface portion and configured to perform an operation on the main body portion, in which
　the back surface member is configured to cover the operation portion.

(5) The electronic apparatus according to any one of (1) to (4), in which
　the back surface of the main body portion is provided with a light source configured to emit light, and
　the back surface portion is provided with a light guide portion configured to transmit therethrough the light emitted from the light source.

(6) The electronic apparatus according to any one of (1) to (5), in which
　the back surface member is configured to cover end portions of the opposite surface of the back surface portion from the rear surface of the back surface portion, the back surface member including end portions that are wrapped around and fixed to the opposite surface of the back surface portion.

(7) The electronic apparatus according to (2) or (3), in which
　the stand includes
　　a rotating mechanism that is provided in the rear surface of the back surface portion, and
　　a movable member that is supported by the rotating mechanism to move away from the back surface portion and move closer to the back surface portion.

(8) The electronic apparatus according to (2) or (3), in which
　the stand includes
　　a guide portion that is formed in the rear surface of the back surface portion,
　　two sliders that are supported by the guide portion to be movable, and
　　a wire that couples the two sliders to each other, and
　the guide portion is provided with an adjuster configured to adjust positions of the two sliders.

(9) The electronic apparatus according to any one of (1) to (8), in which
　the main body portion includes a communication unit configured to be wirelessly communicable with an external apparatus.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2011-281971 filed in the Japan Patent Office on Dec. 22, 2011, the entire content of which is hereby incorporated by reference.

What is claimed is:

1. An electronic apparatus, comprising:
　a main body portion that includes a display portion and is configured to process inputted information;
　a back surface portion configured to cover a back surface of the main body portion on an opposite side of the display portion;

a movable portion that is mounted to a rear surface of the back surface portion on an opposite side of an opposite surface of the back surface portion, the opposite surface being opposed to the main body portion; and a back surface member that has stretch properties and is configured to cover the back surface portion and the movable portion.

2. The electronic apparatus according to claim 1, wherein the movable portion includes a stand configured to hold postures of the main body portion and the back surface portion.

3. The electronic apparatus according to claim 2, wherein the stand is configured to be capable of changing the postures of the main body portion and the back surface portion in at least two stages.

4. The electronic apparatus according to claim 3, further comprising an operation portion that is exposed from the rear surface of the back surface portion and configured to perform an operation on the main body portion, wherein the back surface member is configured to cover the operation portion.

5. The electronic apparatus according to claim 4, wherein the back surface of the main body portion is provided with a light source configured to emit light, and the back surface portion is provided with a light guide portion configured to transmit therethrough the light emitted from the light source.

6. The electronic apparatus according to claim 5, wherein the back surface member is configured to cover end portions of the opposite surface of the back surface portion from the rear surface of the back surface portion, the back surface member including end portions that are wrapped around and fixed to the opposite surface of the back surface portion.

7. The electronic apparatus according to claim 6, wherein the stand includes a rotating mechanism that is provided in the rear surface of the back surface portion, and a movable member that is supported by the rotating mechanism to move away from the back surface portion and move closer to the back surface portion.

8. The electronic apparatus according to claim 6, wherein the stand includes a guide portion that is formed in the rear surface of the back surface portion, two sliders that are supported by the guide portion to be movable, and a wire that couples the two sliders to each other, and the guide portion is provided with an adjuster configured to adjust positions of the two sliders.

9. The electronic apparatus according to claim 6, wherein the main body portion includes a communication unit configured to be wirelessly communicable with an external apparatus.

* * * * *